United States Patent
Lee

(10) Patent No.: US 12,004,268 B2
(45) Date of Patent: Jun. 4, 2024

(54) TRANSFERRING UNIT, SUBSTRATE TREATING APPARATUS INCLUDING THE SAME, AND SUBSTRATE TREATING METHOD

(71) Applicant: SEMES CO., LTD., Cheonan-si (KR)

(72) Inventor: Ji-Hwan Lee, Suwon-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 792 days.

(21) Appl. No.: 17/091,054

(22) Filed: Nov. 6, 2020

(65) Prior Publication Data
US 2021/0144809 A1 May 13, 2021

(30) Foreign Application Priority Data
Nov. 7, 2019 (KR) .......................... 10-2019-0141709

(51) Int. Cl.
*H01L 21/67* (2006.01)
*H05B 1/02* (2006.01)

(52) U.S. Cl.
CPC ..... *H05B 1/0233* (2013.01); *H01L 21/67098* (2013.01)

(58) Field of Classification Search
CPC ........... H01L 21/68742; H01L 21/6875; H01L 21/68785; H01L 21/67098; H01L 21/67103; H01L 21/67109; G03F 7/0875
See application file for complete search history.

(56) References Cited

U.S. PATENT DOCUMENTS

| | | | | |
|---|---|---|---|---|
| 10,274,827 B2 * | 4/2019 | Lee | ....................... | G03F 7/0035 |
| 10,763,152 B2 * | 9/2020 | Jo | ...................... | H01L 21/67769 |
| 10,908,503 B2 * | 2/2021 | Choi | ................. | H01L 21/67028 |
| 11,145,524 B2 * | 10/2021 | Chi | ......................... | G03F 7/16 |
| 11,148,150 B2 * | 10/2021 | Choi | ....................... | B05B 1/044 |
| 11,320,752 B2 * | 5/2022 | Bang | ................. | H01L 21/67178 |
| 11,404,293 B2 * | 8/2022 | Bang | ................. | H01L 21/67248 |
| 11,557,477 B2 * | 1/2023 | Park | .................. | H01L 21/68707 |
| 2003/0175947 A1 * | 9/2003 | Liu | ......................... | B82Y 30/00 |
| | | | | 422/68.1 |

(Continued)

FOREIGN PATENT DOCUMENTS

| CN | 101840853 A | * | 9/2010 |
|---|---|---|---|
| CN | 105321853 A | | 2/2016 |

(Continued)

OTHER PUBLICATIONS

Officer Action for Korean Application No. 10-2019-10141709 dated Nov. 16, 2021.

(Continued)

Primary Examiner — Kaitlin S Joerger
(74) Attorney, Agent, or Firm — Harness, Dickey & Pierce, P.L.C.

(57) ABSTRACT

A transferring unit, a substrate treating apparatus including the same, and a substrate treating method are provided. The substrate treating apparatus includes a support plate, a plurality of protrusions protruding upward from the support plate to support a substrate, a temperature adjusting member provided in the support plate to heat or cool the substrate, and an ultrasound applying member to apply an ultrasound between the substrate placed on the plurality of protrusions and the support plate.

13 Claims, 8 Drawing Sheets

(56) References Cited

U.S. PATENT DOCUMENTS

| | | | | |
|---|---|---|---|---|
| 2005/0252455 A1* | 11/2005 | Moriya | ............. | H01L 21/67248 |
| | | | | 118/729 |
| 2008/0072925 A1 | 3/2008 | Park et al. | | |
| 2021/0129394 A1* | 5/2021 | Saito | ................. | H01L 21/67103 |
| 2022/0100096 A1* | 3/2022 | Kim | .................. | H01L 21/68742 |

FOREIGN PATENT DOCUMENTS

| | | | | |
|---|---|---|---|---|
| CN | 107546123 | A | | 1/2018 |
| CN | 108122817 | A | | 6/2018 |
| CN | 108735629 | A | | 11/2018 |
| CN | 112786490 | A | * | 5/2021 |
| CN | 115472549 | A | * | 12/2022 |
| DE | 102020213864 | A1 | * | 5/2021 |
| JP | H11-329926 | A | | 11/1999 |
| JP | 2014-103230 | A | | 6/2014 |
| JP | 2014-103231 | A | | 6/2014 |
| KR | 100238940 | B1 | | 1/2000 |
| KR | 100757417 | B1 | * | 9/2007 ........... H01L 21/304 |
| KR | 10-2007-0098674 | A | | 10/2007 |
| KR | 10-2016-0017699 | A | | 2/2016 |
| KR | 2016-0081010 | A | | 7/2016 |
| KR | 2018-0123789 | A | | 11/2018 |
| WO | WO-2018230806 | A1 | * | 12/2018 |

OTHER PUBLICATIONS

Notice of Allowance dated Nov. 9, 2022 issued in related Korean patent application No. 10-2019-0141709.

Office Action for Korean Application No. 10-2019-0141709 dated May 3, 2021.

Chinese Office Action dated Jan. 9, 2024 issued in Chinese Patent Application No. 202011239668.3.

* cited by examiner

TRANSFERRING UNIT, SUBSTRATE TREATING APPARATUS INCLUDING THE SAME, AND SUBSTRATE TREATING METHOD

CROSS-REFERENCE TO RELATED APPLICATIONS

A claim for priority under 35 U.S.C. § 119 is made to Korean Patent Application No. 10-2019-0141709 filed on Nov. 7, 2019, in the Korean Intellectual Property Office, the entire contents of which are hereby incorporated by reference.

BACKGROUND

Embodiments of the inventive concept relate to a substrate treating apparatus and a substrate treating method, and more particularly, relate to a transferring unit to transfer a substrate, a substrate treating apparatus including the same, and a substrate treating method.

In general, to fabricate a semiconductor device, various processes, such as cleaning, depositing, photolithography, etching, and ion implanting processes are performed. Among them, the photolithography process, which is to form a pattern, plays an important role to implement the higher integration of the semiconductor device.

The photolithography process is performed to form a photoresist pattern on a substrate of the semiconductor. The photolithography process includes a coating process to form a photoresist film on a substrate, an exposing process to form a photoresist pattern from the photoresist film, or a developing process to remove an area to which light is irradiated in the exposing process or an opposite area, and a bake process is performed to heat and cool the substrate before and after the process.

The bake process is to heat the substrate through a heating unit. The heating unit has a heating plate to place a wafer. Before a process is completed with respect to wafers belonging to one group, and then a process is performed with respect to wafers belonging to the following group, the temperature of the heating plate should be adjusted to be appropriate to a process condition (e.g., a heating temperature) of wafers belonging to the following group described above. The temperature of the heating plate may be rapidly increased as thermal energy applied to the heating plate is increased.

However, since the temperature of the heating plate is decreased through a natural cooling manner, a lot of time is taken to cool the heating plate to a desired temperature. The time taken to perform the natural cooling manner corresponds to a process standby time to significantly reduce a capacity utilization rate.

In addition, there occurs a phenomenon in which a substrate is temporarily attached to a cooling plate when the substrate is lifted from the cooling plate to cool the substrate, or a squeeze phenomenon in which the substrate is broken, after the substrate is cooled.

SUMMARY

Embodiments of the inventive concept provide a transferring unit capable of increasing the cooling efficiency of a substrate during a bake process, a substrate treating apparatus including the same, and a substrate treating method.

Embodiments of the inventive concept provide a transferring unit capable of minimizing the squeeze phenomenon of a substrate, a substrate treating apparatus including the same, and a substrate treating method.

The objects which will be achieved in the inventive concept are not limited to the above, but other objects, which are not mentioned, will be apparently understood to those skilled in the art.

The inventive concept provides a substrate treating apparatus. According to an exemplary embodiment, the substrate treating apparatus may include a support plate, a plurality of protrusions protruding upward from the support plate to support a substrate, a temperature adjusting member provided in the support plate to heat or cool the substrate, and an ultrasound applying member to apply an ultrasound between the substrate placed on the plurality of protrusions and the support plate.

According to an embodiment, the temperature adjusting member may be a cooling member that cools the substrate.

According to an embodiment, the temperature adjusting member may have a cooling fluid passage provided in the support plate.

According to an embodiment, the temperature adjusting member may be a heating member to heat the substrate.

According to an embodiment, the ultrasound applying member may apply the ultrasound in a direction parallel to the substrate.

According to an embodiment, the ultrasound applying member may be provided at a side portion of the support plate.

Further, according to an exemplary embodiment, a substrate treating apparatus may include a housing, a heating unit including a heating plate positioned inside the housing to heat a substrate, and a transferring unit positioned inside the housing to transfer the substrate from the heating plate. The transferring unit may include a transferring plate to place the substrate, protrusions protruding upward from the transferring plate to support the substrate, a cooling unit to cool the substrate which is heated, and an ultrasound applying member to apply an ultrasound between the substrate and the transferring plate.

According to an embodiment, the cooling unit may be provided in the transferring plate.

According to an embodiment, the cooling unit may be a cooling fluid passage.

According to an embodiment, the ultrasound applying member may apply the ultrasound in a direction parallel to the substrate.

According to an embodiment, the substrate treating apparatus may further include a driver to drive the transferring plate, and the ultrasound applying member may be provided in the driver.

In addition, the inventive concept provides a transferring unit. According to an exemplary embodiment, the transferring unit may include a transferring plate to place a substrate, protrusions protruding upward from the transferring plate to support the substrate, a cooling unit provided in the transferring plate to cool the substrate which is heated, and an ultrasound applying member to apply an ultrasound between the substrate and the transferring plate.

According to an embodiment, the cooling unit may be provided in the transferring plate.

According to an embodiment, the cooling unit may be a cooling fluid passage.

According to an embodiment, the ultrasound applying member may be provided to apply an ultrasound in a direction parallel to the substrate.

According to an embodiment, the transferring unit may further include a driver to drive the transferring plate, and the ultrasound applying member may be provided in the driver.

Further, the inventive concept provides a substrate treating method. According to an exemplary embodiment, the substrate treating method may include applying an ultrasound between a substrate and a support plate while the substrate is heated or cooled, in a state that the substrate is supported to a protrusion protruding upward from the support plate.

According to an embodiment, the substrate may be heated or cooled by a temperature adjusting member provided in the support plate.

According to an embodiment, the support plate may be provided in a transferring unit to transfer the substrate, and the substrate may be heated and cooled in a state that the substrate is supported to the transferring unit.

According to an embodiment, substrate is heated or cooled by a temperature adjusting member provided in the support plate.

According to an embodiment, treating the substrate may further include heating the substrate by the heating unit, the substrate heated by the heating unit may be transferred from the heating unit to another unit by the transferring unit, and the substrate may be cooled on the transferring unit while the substrate is transferred from the heating unit to another unit.

According to an embodiment, the ultrasound may be applied in a direction parallel to the substrate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
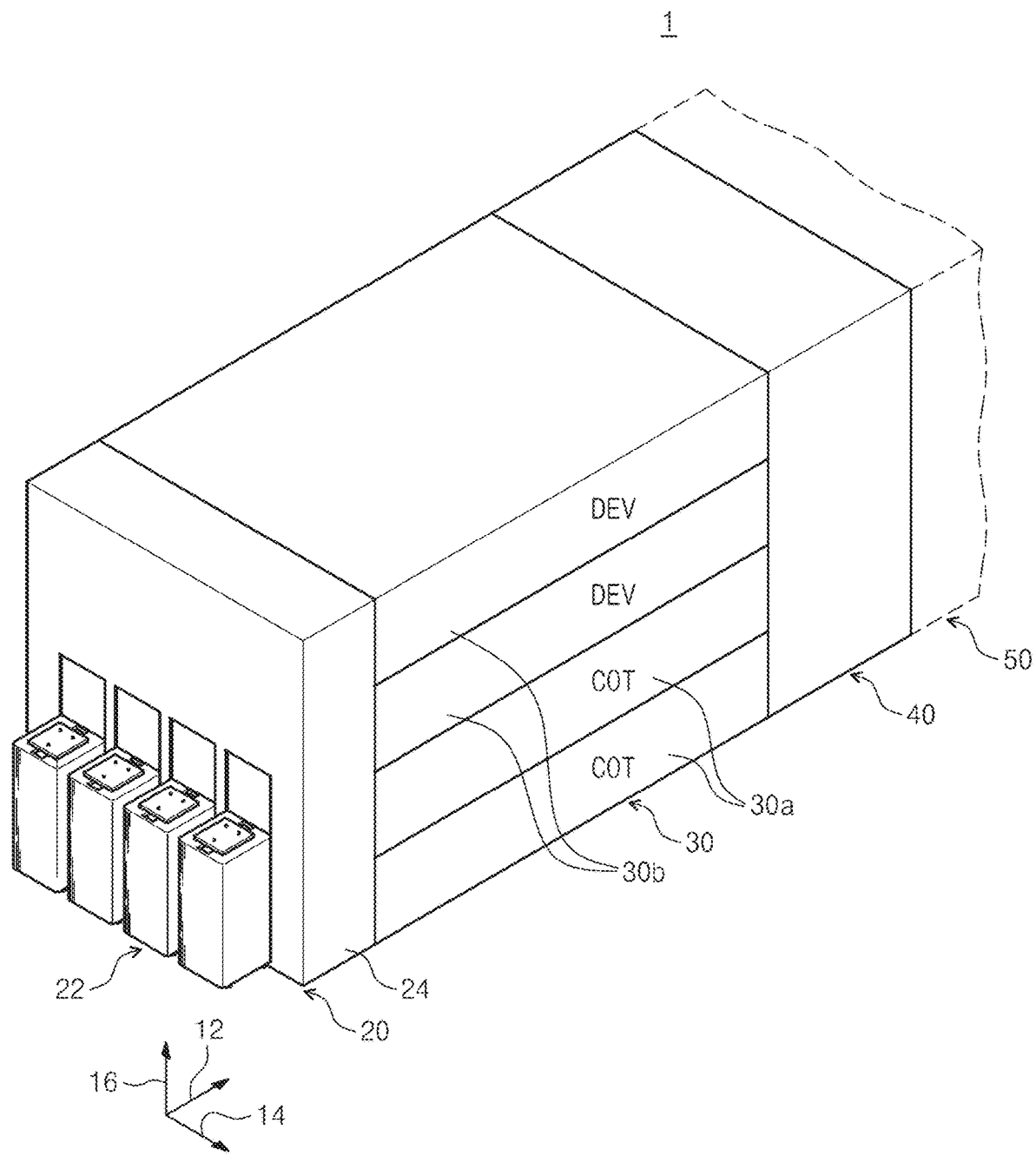
FIG. 1 is a perspective view schematically illustrating a substrate treating apparatus, according to an embodiment of the inventive concept.

Hereinafter, an embodiment of the inventive concept will be described in more detail with reference to the accompanying drawings. The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

Figure 2:
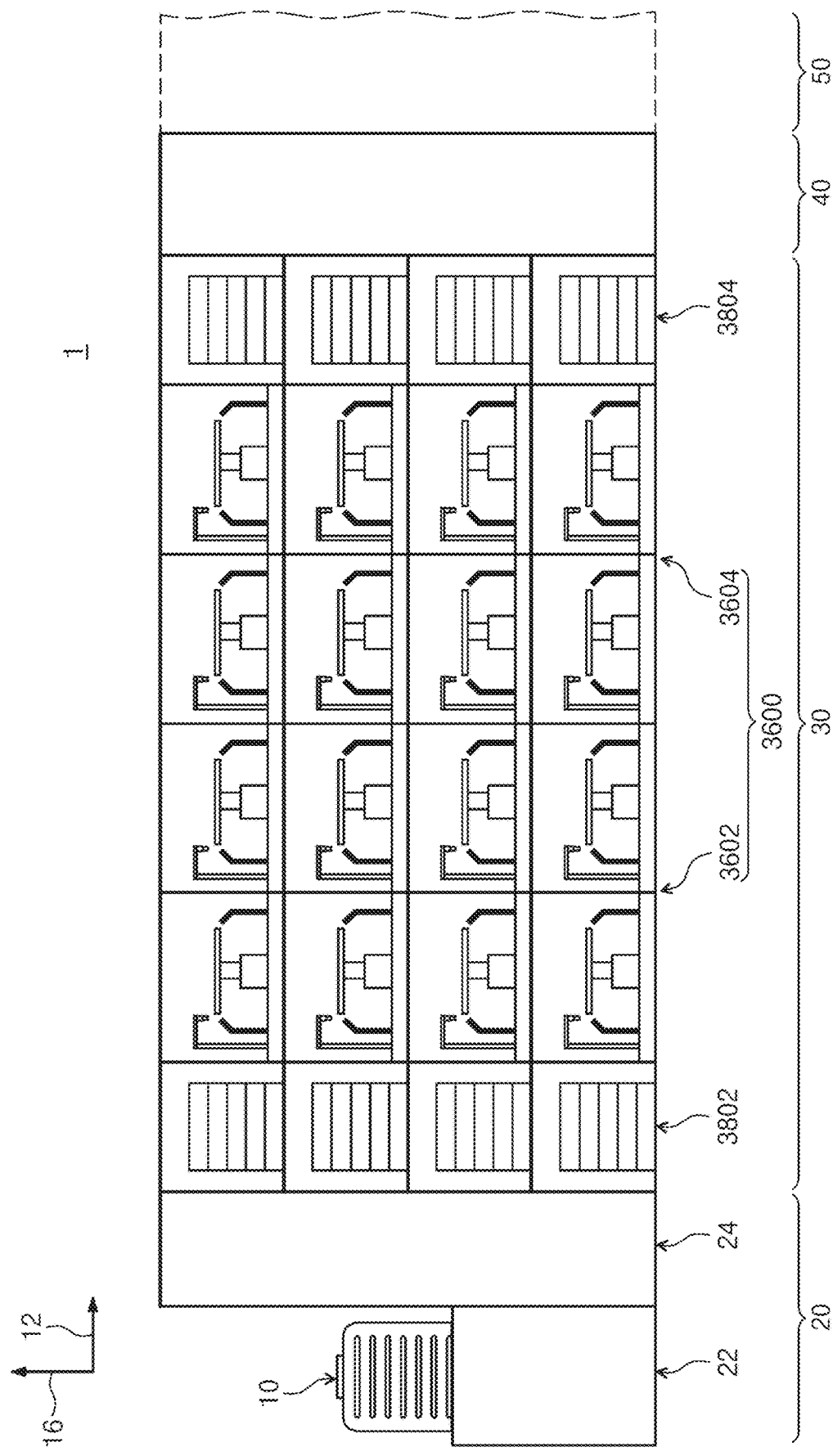
FIG. 2 is a sectional view of a substrate treating apparatus, which illustrates a coating block or a developing block of FIG. 1.
Figure 3:
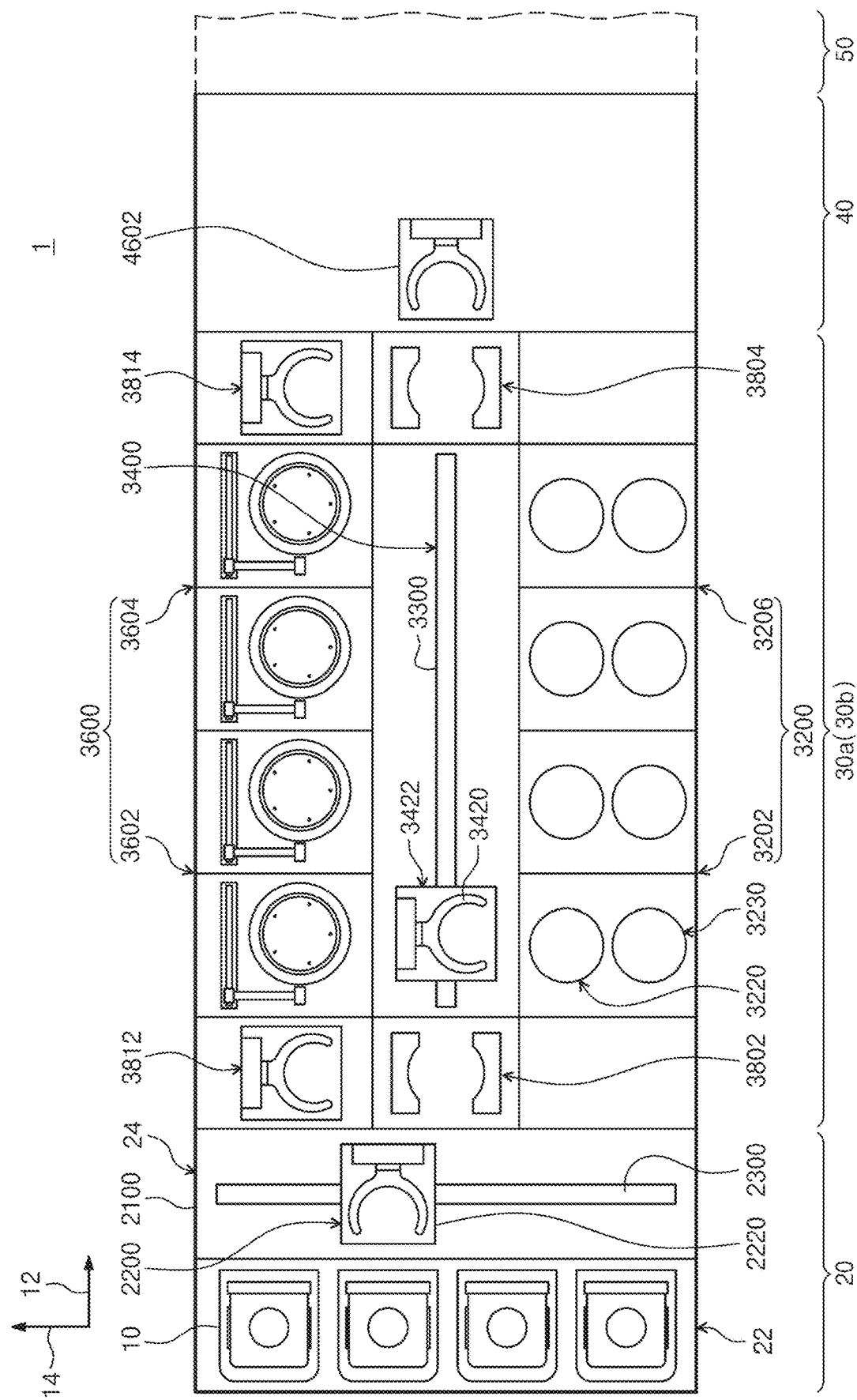
FIG. 3 is a plan view illustrating the substrate treating apparatus of FIG. 1.

FIG. 1 is a perspective view schematically illustrating a substrate treating apparatus, according to an embodiment of the inventive concept, FIG. 2 is a sectional view of a substrate treating apparatus, which illustrates a coating block or a developing block of FIG. 1, and FIG. 3 is a plan view illustrating the substrate treating apparatus of FIG. 1.

Referring to FIGS. 1 to 3, a substrate treating apparatus 1 includes an index module 20, a treating module 30, and an interface module 40. According to an embodiment, the index module 20, the treating module 30, and the interface module 40 are sequentially aligned in line with each other. Hereinafter, a direction in which the index module 20, the treating module 30, and the interface module 40 are arranged will be referred to as a first direction 12, a direction that is perpendicular to the first direction 12 when viewed from above will be referred to as a second direction 14, and a direction perpendicular to all the first direction 12 and the second direction 14 will be referred to as a third direction 16.

The index module 20 transfers a substrate 'W' to the treating module 30 from a container 10, in which the substrate 'W' is received, and a substrate 'W' completely treated is received into the container 10. The longitudinal direction of the index module 20 is provided in the second direction 14. The index module 20 has a loadport 22 and an index frame 24. The loadport 22 is positioned at an opposite side of the treating module 30, based on the index frame 24. The container 10 having substrates 'W' is placed on the loadport 22. A plurality of load ports 22 may be provided and may be arranged in the second direction 14.

The container 10 may include a container 10 for sealing such as a front open unified pod (FOUP). The container 10 may be placed on the load port 22 by a transport unit (not illustrated) such as Overhead Transfer, Overhead Conveyor, or Automatic Guided Vehicle, or a worker.

An index robot 2200 is provided inside the index frame 24. A guide rail 2300, which has a longitudinal direction provided in the second direction 14, may be provided in the index frame 24, and the index robot 2200 may be provided to be movable on the guide rail 2300 The index robot 2200 may include a hand 2220 in which the substrate 'W' is positioned, and the hand 2220 may be provided to be movable forward and backward, rotatable about the third direction 16, and movable in the third direction 16. According to an embodiment, the index robot 2200 may be provided to directly transmit and receive the substrate 'W' together with a heating unit 3230 of a front heat treating chamber 3200 provided in the coating block 30a.

The treating module 30 performs coating and developing processes with respect to the substrate 'W'. The treating module 30 has a coating block 30a and a developing block 30b. The coating block 30a forms a coating process with respect to the substrate 'W', and the developing block 30b performs a developing process with respect to the substrate 'W'. A plurality of coating blocks 30a are provided and stacked on each other. A plurality of developing blocks 30b are provided, and stacked on each other.

According to an embodiment of FIG. 1, two coating blocks 30a are provided and two developing blocks 30b are provided. The coating blocks 30*a* may be disposed under the developing blocks 30*b*. According to an example, two coating blocks 30*a* may be subject to the same process and may be provided in the same structure. In addition, two developing blocks 30*a* may be subject to the same process and may be provided in the same structure.

A transferring robot 3422 provided in the coating block 30*a* and the developing block 30*b* may be provided to directly exchange the substrate 'W' with a transferring unit 3420 positioned in the heat treating chamber 3200.

Referring to FIG. 3, the coating block 30*a* has the heat treating chamber 3200, a transferring chamber 3400, a liquid treating chamber 3600, and a buffer chamber 3800. The heat treating chamber 3200 performs a heat treatment process with respect to the substrate 'W'. The heat treatment process may include a cooling process and a heating process. The liquid treating chamber 3600 supplies a liquid onto the substrate 'W' to form a liquid film. The liquid film may be a photoresist film or an anti-reflective film. The transferring chamber 3400 carries the substrate 'W' between the heat treating chamber 3200 and the liquid treating chamber 3600 inside the coating block 30*a*.

The transferring chamber 3400 has a longitudinal direction parallel to the first direction 12. The transferring robot 3422 is provided in the transferring chamber 3400. The transferring robot 3422 transfers the substrate 'W' among the heat treating chamber 3200, the liquid treating chamber 3600, and the buffer chamber 3800. According to an example, the transferring robot 3422 may include a hand 3420 in which the substrate 'W' is positioned, and the hand 3420 may be provided to be movable forward and backward, rotatable about the third direction 16, and movable in the third direction 16. A guide rail 3300, which has a longitudinal direction parallel to the second direction 12, is provided in the transferring chamber 3400, and the transferring robot 3422 may be provided to be movable on the guide rail 3300.

A plurality of liquid treating chambers 3600 are provided. Some of the liquid treating chambers 3600 may be provided to be stacked on each other. The liquid treating chambers 3600 are positioned at one side of the transferring chamber 3400. The liquid treating chambers 3600 are arranged in line with each other in the first direction 12. Some of the liquid treating chambers 3600 are provided in a position adjacent to the index module 20. Hereinafter, these liquid treating chambers 3602 are referred to as front liquid treating chambers. Others of the liquid treating chambers 3600 are provided in a position adjacent to the interface module 40. Hereinafter, these liquid treating chambers are referred to as rear liquid treating chambers 3604.

A first liquid is coated on the substrate 'W' in the front liquid treating chamber 3602, and a second liquid is coated on the substrate 'W' in the rear liquid treating chamber 3604. The first liquid may be different from the second liquid. According to an embodiment, the first liquid is an anti-reflective liquid, and the second liquid is photoresist. The photoresist may be coated on the substrate 'W' having an anti-reflective film. Alternatively, the first liquid may be photoresist and the second liquid may be an anti-reflective liquid. In this case, the anti-reflective liquid may be coated onto the substrate 'W' coated with photoresist. Alternatively, the first liquid and the second liquid may be the same type of liquids, and all the first liquid and the second liquid may be photoresist.

A plurality of liquid treating chambers 3800 are provided. Some of buffer chambers 3800 are interposed between the index module 20 and the transferring chamber 3400. Hereinafter, the buffer chamber is referred to as a front buffer. A plurality of front buffers 3802 are provided and stacked on each other in the vertical direction. Others of the buffer chambers 3802 and 3804 are interposed between the transfer chamber 3400 and the interface module 40. Hereinafter, the buffer chambers are referred to as rear buffers 3804.

A plurality of rear buffers 3804 are provided and stacked on each other in the vertical direction. The front buffers 3802 and the rear buffers 3804 temporarily store a plurality of substrates 'W'. The substrate 'W' stored in the front buffer 3802 is introduced and withdrawn by the index robot 2200 and the transferring robot 3422. The substrate 'W' stored in the rear buffer 3804 is introduced and withdrawn by the transferring robot 3422 and the first robot 4602 provided in the index module 40.

The developing block 30*b* has the heat treating chamber 3200, the transferring chamber 3400, and the liquid treating chamber 3600. Since the heat treating chamber 3200, the transferring chamber 3400, and the liquid treating chamber 3600 in the developing block 30*b* have the structures and the arrangement substantially similar to those of the heat treating chamber 3200, the transferring chamber 3400, and the liquid treating chamber 3600 in the coating block 30*a*, the details thereof will be omitted. However, all the liquid treating chambers 3600 in the developing block 30*b* supply the same developing liquid such that the substrate 'W' is subject to the developing treatment.

The interface module 40 connects the treating module 30 with an external exposing device 50.

Figure 4:
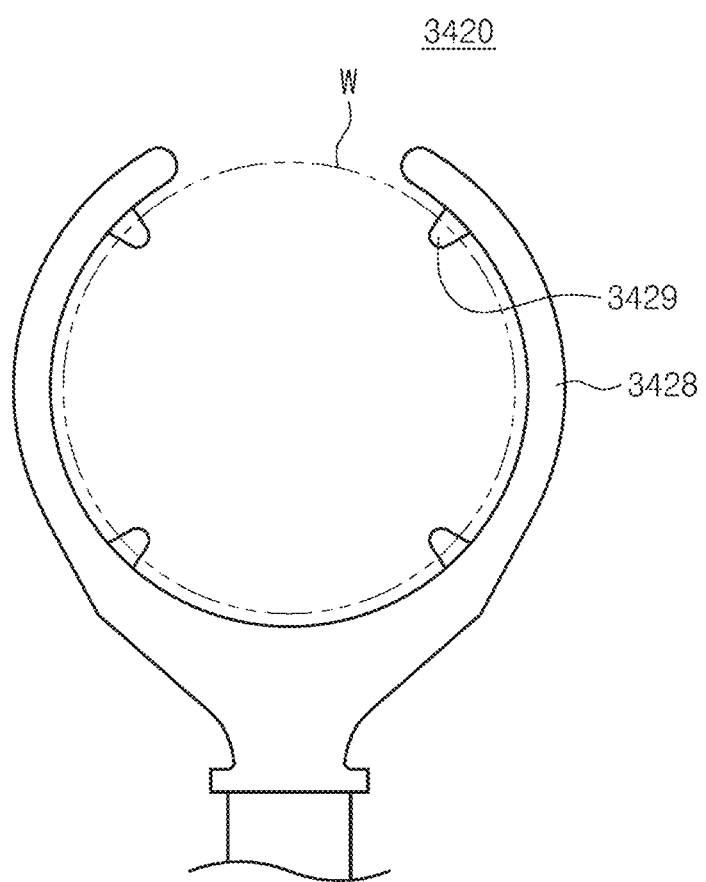
FIG. 4 is a view illustrating a hand of a transferring unit of FIG. 3.

FIG. 4 is a view illustrating a hand of a transferring unit of FIG. 3. Referring to FIG. 4, a hand 3420 has a base 3428 and a supporting protrusion 3429. The base 3428 may have an annular ring shape in which a part of the circumference is bent. The base 3428 has an inner diameter greater than the diameter of the substrate 'W'. The supporting protrusion 3429 extends inward from base 3428. A plurality of supporting protrusions 3429 are provided to support an edge area of the substrate 'W'. According to an example, four supporting protrusions 3429 may be provided at equal distances.

A plurality of liquid treating chambers 3200 are provided. The heat treating chambers 3200 are arranged in the first direction 12. The heat treating chambers 3200 are positioned at one side of the transferring chamber 3400.

Figure 5:
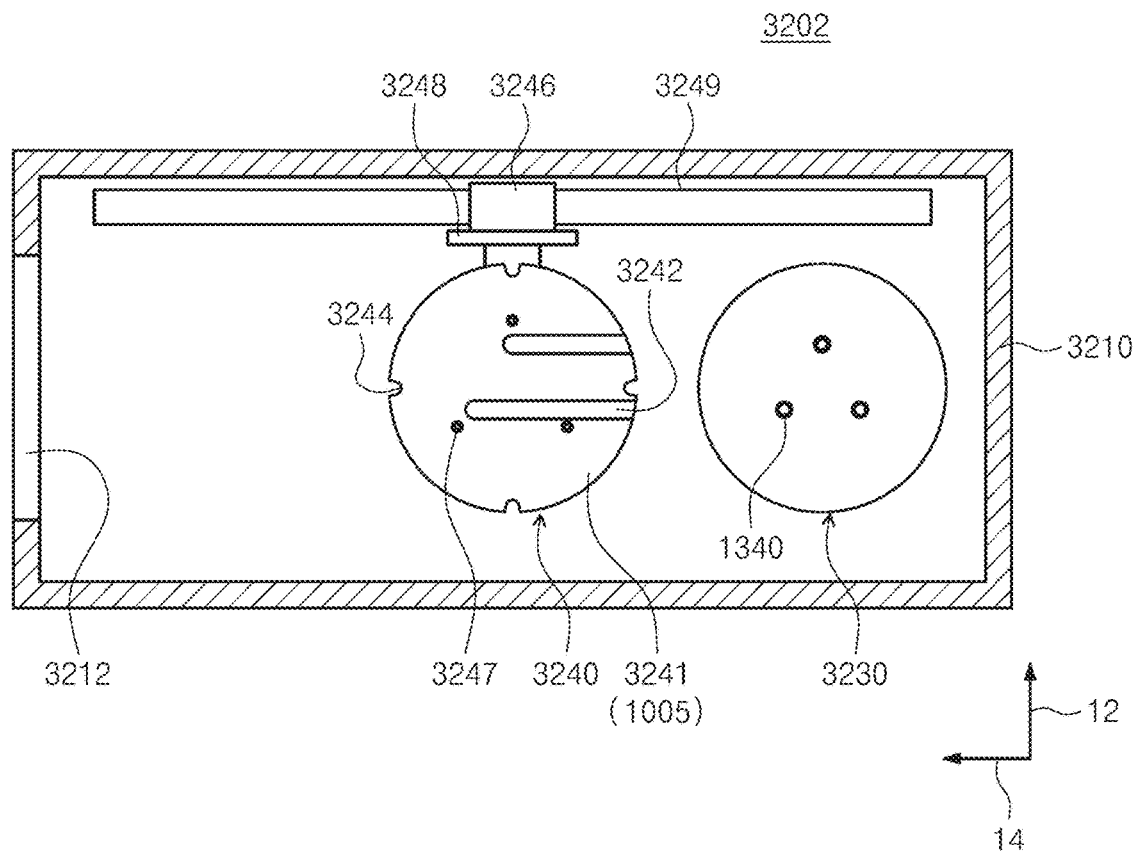
FIG. 5 is a plan view schematically illustrating a heat treating chamber of FIG. 3.
Figure 6:
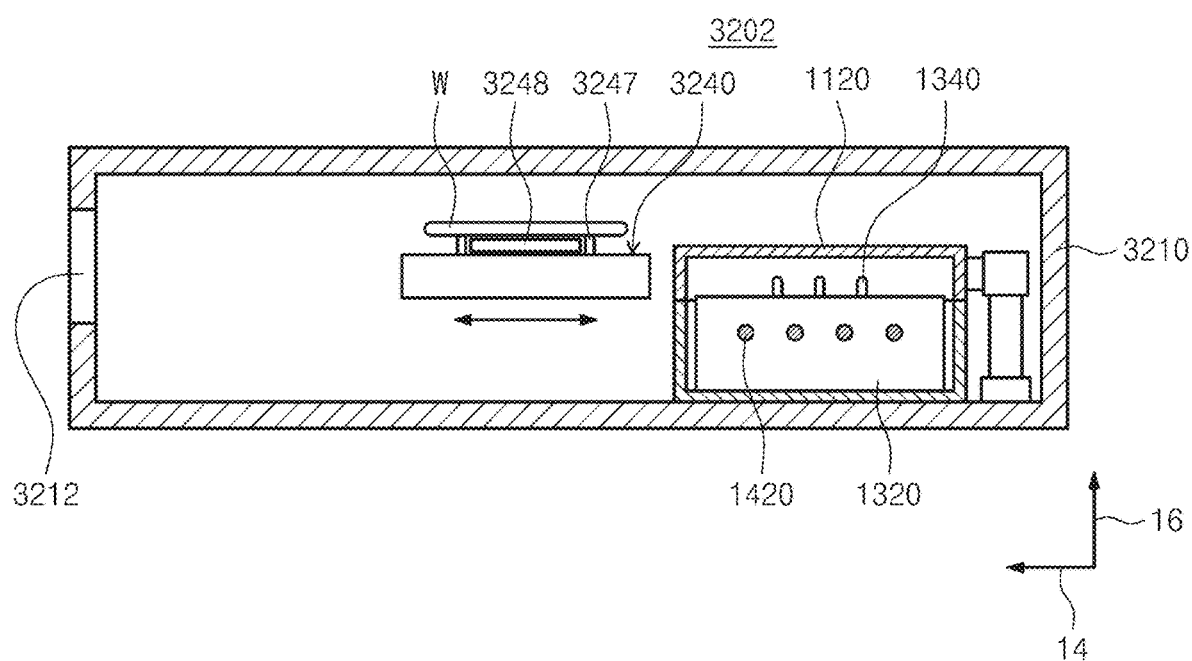
FIG. 6 is a front view illustrating the heat treating chamber of FIG. 5.

FIG. 5 is a plan view schematically illustrating a heat treating chamber of FIG. 3, and FIG. 6 is a front view illustrating the heat treating chamber of FIG. 3. Referring to FIGS. 5 and 6, the heat treating chamber 3200 has a housing 3210, a heating unit 3230, a transferring unit 3240, a cooling unit 1005, and an ultrasound applying member 3248.

The housing 3210 substantially has a rectangular parallelepiped shape. The housing 3210 is formed in a sidewall thereof with an entrance (not illustrated) to introduce or withdraw the substrate 'W'. The entrance 3212 may be selectively maintained in an open sate. A door (not illustrated) may be provided to selectively open or close the entrance. The heating unit 3230 and the transferring unit 3240 are provided in the housing 3210.

The heating unit 3230 includes a heating plate 1320, a cover 1120, a cover driver (not illustrated), a heater 1420, and a lift pin 1340.

The heating plate 1320 heats the substrate 'W' at an atmosphere having atmospheric pressure or lower. The cover 1120 is positioned above the heating plate 1320 to provide a heating space therein. The cover 1120 moves onto the heating plate 1320 by the cover driver 1130 when the substrate 'W' is moved to a peripheral portion of the heating plate 1320. The cover 1120 moves downward by the cover driver 1130 to form the heating space to heat the substrate 'W', when the substrate 'W' is heated by the heating plate 1320.

A heater unit 1420 heats the substrate 'W' placed on the heating plate 1320. The heater unit 1420 is positioned under the substrate 'W' placed on the heating plate 1320. The heater unit 1420 includes a plurality of heaters 1420. The heaters 1420 are positioned inside the heating plate 1320. Selectively, the heaters 1420 may be positioned on the bottom surface of the heating plate 1320. The heaters 1420 are positioned on the same plane.

The lift pin 1340 moves up and down the substrate 'W' on the heating plate 1320. A plurality of lift pins 1340 are provided, and each lift pin 1340 is provided in the shape of a pin facing in a vertical direction. A driving member (not illustrated) moves each lift pin 1340 between a moving-up position and a moving-down position. The driving member (not illustrated) may be a cylinder. The driving member (not illustrated) may be provided outside the cover 1120.

The transferring unit 3240 includes the transferring plate 3241. The transferring plate 3241 is provided in the shape of a substantially disk plate, and has a diameter corresponding to that of the substrate 'W'. The transferring plate 3241 may be mounted on the guide rail 3249, and may move in the first direction 12 along the guide rail 3249 by the driver 3246. A notch 3244 is formed in an edge of the transferring plate 3241. The notch 3244 may have the shape corresponding to that of the supporting protrusion 3429 formed on the hand 3420 of the transferring robot 3424. In addition, notches 3244 may be provided in number corresponding to the number of supporting protrusions 3429 formed in the hand 3420 and may be formed at positions corresponding to those of the supporting protrusions 3429.

When the vertical positions of the hand 3420 and the transferring unit 3240 are changed in the state that the hand 3420 and the transferring unit 3240 are aligned in the vertical direction, the substrate 'W' is transferred between the hand 3420 and the transferring unit 3240.

A plurality of guide grooves 3242 are provided in the shape of a slit in the transferring unit 3240. The guide groove 3242 extends inward from an end portion of the transferring unit 3240. The longitudinal direction of the guide groove 3242 is provided in the second direction 14, and the guide grooves 3242 are positioned to be spaced apart from each other in the first direction 12. The guide groove 3242 prevents the interference between the transferring unit 3240 and the lift pin 1340 when the substrate 'W' is transferred between the transferring unit 3240 and the heating unit 3230

The transferring plate 3241 includes a material having an excellent heat transfer rate such that the cooling efficiency of the transferring plate 3241 is improved. According to an embodiment, the transferring plate 3241 may be formed of a metal material. In addition, the transferring plate 3241 includes the cooling unit 1005. According to an embodiment, the cooling unit 1005 may be a cooling fluid passage. A plurality of protrusions 3247 protruding upward from the transferring plate 3241 are formed on the transferring plate 3241. When the substrate 'W' is supported to the protrusion 3247, the substrate 'W' and the transferring plate 3241 are spaced apart from each other.

Figure 7:
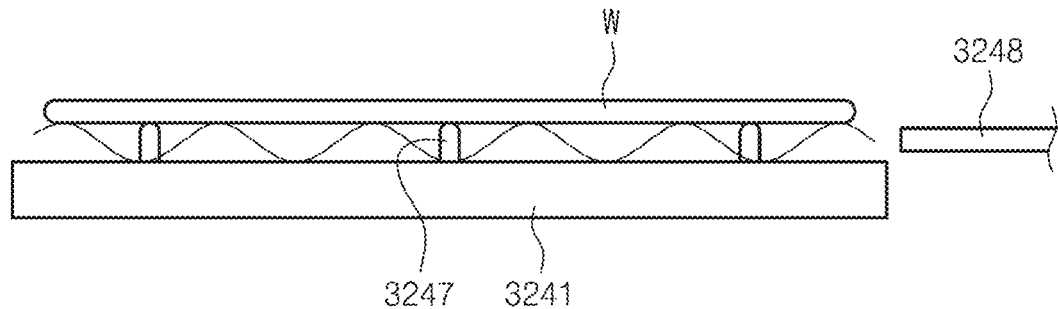
FIG. 7 is a view illustrating that an ultrasound applying member applies an ultrasound, according to an embodiment of the inventive concept.

FIG. 7 is a view illustrating that an ultrasound applying member applies an ultrasound, according to an embodiment of the inventive concept. Referring to FIG. 7, an ultrasound applying member 3248 applies to a space between the substrate 'W' and the transferring plate 3241 spaced apart from each other. According to an embodiment, the ultrasound applying member 3248 is provided to apply the ultrasound in a direction parallel to the substrate 'W'. According to an embodiment, the width of the ultrasound applying member 3248 may be equal to or less than the diameter of the substrate 'W'.

As the ultrasound applying member 3248 applies the ultrasound in the direction parallel to the substrate 'W', the ultrasound applied from the ultrasound applying member 3248 may be propagated to a long distance through the space between the substrate 'W' and the transferring plate 3241. Accordingly, the ultrasound applying member 3248 may apply the ultrasound to the entire portion of the bottom surface of the substrate 'W' without exceeding the substrate 'W' in size.

The ultrasound applied between the substrate 'W' and the transferring plate 3241 generates vortex between the substrate 'W' and the transferring plate 3241. The vortex between the substrate 'W' and the transferring plate 3241 increases a convective heat transfer coefficient between the substrate 'W' and the transferring plate 3241. Accordingly, the stagnation of air between the substrate 'W' and the transferring plate 3241 is minimized, and thus the cooling time of the substrate 'W' is reduced.

Further, as the inventive concept is configured to cool the substrate 'W' during the moving of the substrate 'W' by the transferring plate 3241 in the state that the substrate 'W' inevitably moves, the time to move the substrate 'W' to an additional cooling unit may be reduced.

The ultrasound applying member 3248 is provided at one side of the transferring unit 3240. According to an embodiment, the ultrasound applying member 3248 is provided in the driver 3246. As the ultrasound applying member 3248 is provided in the driver 3248, the ultrasound is applied to the space between the substrate 'W' and the transferring plate 3241 during the movement of the substrate 'W' by the transferring unit 3240.

Figure 8:
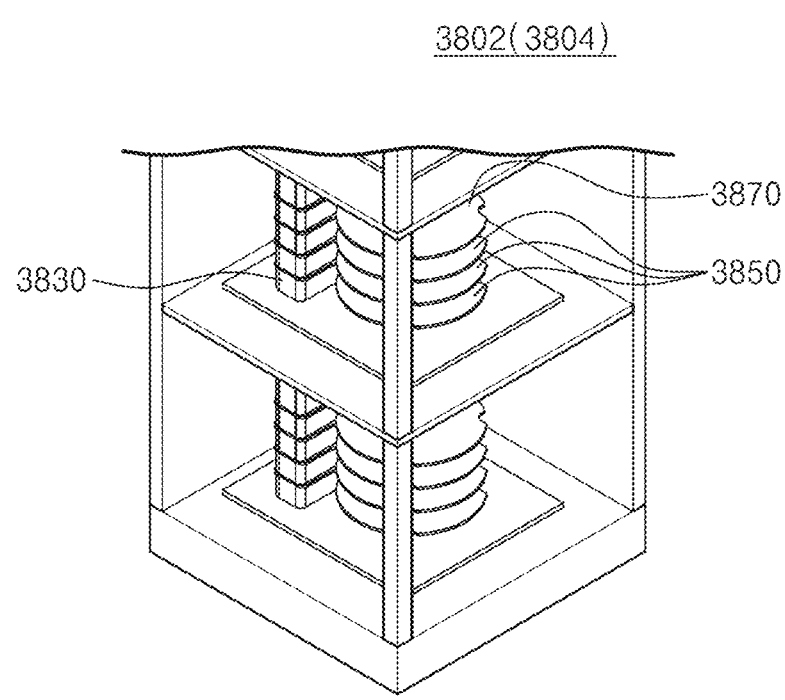
FIGS. 8 and 9 are perspective view schematically illustrating a buffer of FIG. 3.
Figure 9:
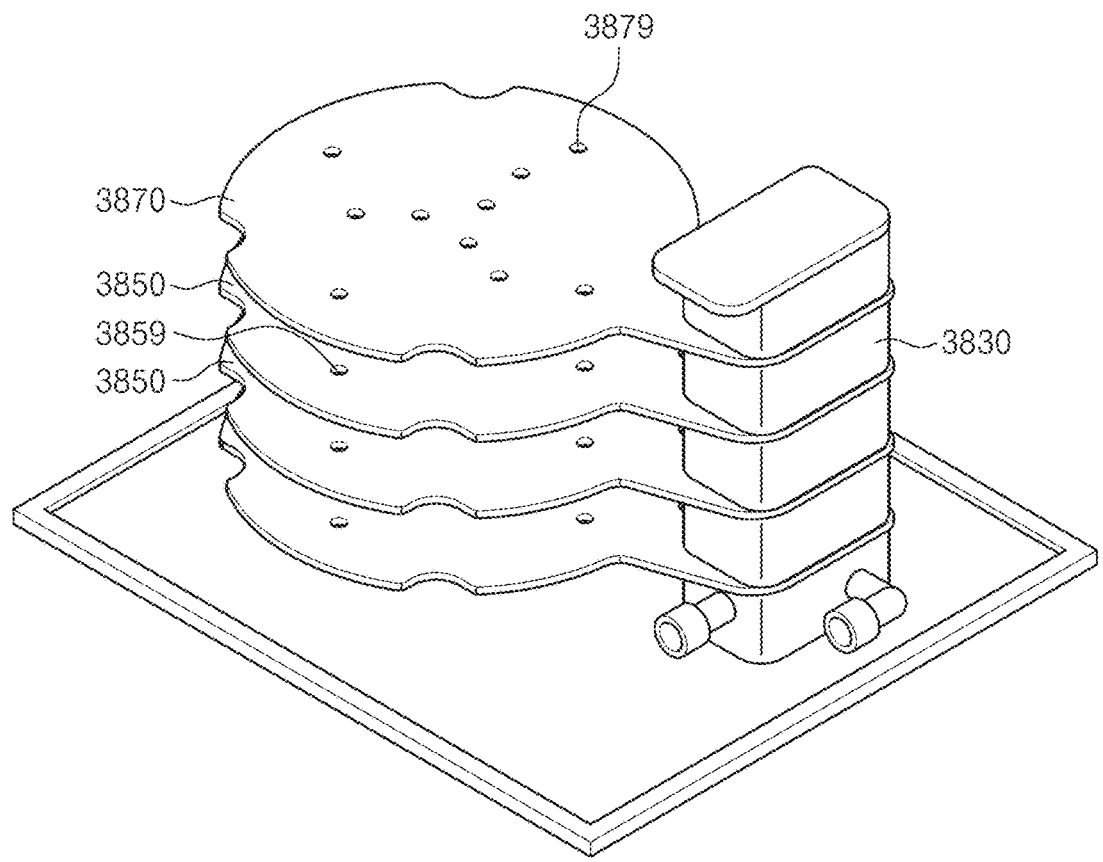

FIGS. 8 to 9 are perspective views schematically illustrating the buffer (front buffer; buffer chamber) 3802 of FIG. 3. Referring to FIGS. 8 to 9, the buffer 3802 includes a buffer plate 3870, a cooling plate 3850, and a support block 3830.

The substrate 'W' is placed on the buffer plate 3870. The buffer plate 3870 is stacked and provided on the cooling plate 3850. The buffer plate 3870 is fixedly coupled to the support block 3830. The buffer plate 3870 is provided in a circular shape. The buffer plate 3870 may be provided in a size corresponding to the substrate 'W'. The buffer plate 3870 may be provided in the same size as that of the cooling plate 3850. A hole 3879 may be provided in the buffer plate 3870. A plurality of holes 3879 may be provided. The hole 3879 may be ventilated to the outside to naturally cool the substrate 'W'. The holes 3879 may be uniformly provided over the entire area of the buffer plate 3870.

The substrate 'W' is placed on the cooling plate 3850. The cooling plate 3850 is provided in the shape of a disk when viewed from above. The cooling plate 3850 may be provided in size corresponding to that of the substrate 'W'. Holes 3859 may be formed in the cooling plate 3850. A plurality of holes 3859 may be provided. The holes 3859 may naturally cool the substrate 'W' through ventilation when the substrate 'W' is placed on the cooling plate 3850

A plurality of cooling plates 3850 are provided. The cooling plates 3850 are stacked and spaced apart from each other. The cooling plates 3850 are fixedly coupled to the support block 3830. The cooling plates 3850 may be provided in equal sizes. The cooling plates 3850 may be provided with equal heights.

A cooling member may be provided inside the cooling plate 3850 and the support block 3830. The cooling member may cool the substrate 'W' placed on the cooling plate 3850. The cooling member may employ various manners such as cooling using cooling water and cooling using a thermoelectric element. In addition, the buffer 3802 may include a lift pin assembly 3857 to position the substrate 'W' on the cooling plate 3850.

Figure 10:
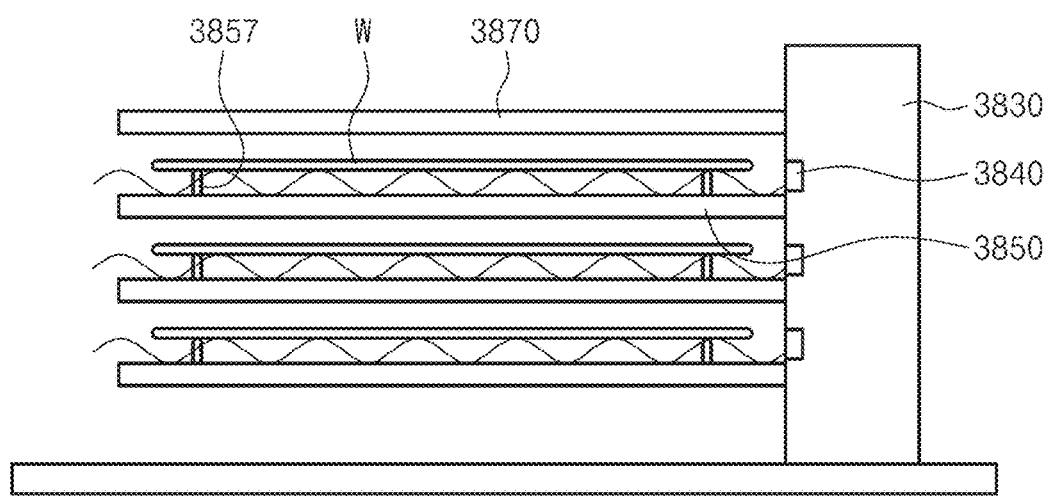
FIG. 10 is a view illustrating that an ultrasound applying member applies an ultrasound, according to another embodiment of the inventive concept.

FIG. 10 is a view illustrating that the ultrasound applying member 3248 mounted in the buffer 3802 applies an ultrasound, according to an embodiment of the inventive concept. Referring to FIG. 10, the ultrasound applying member 3248 applies the ultrasound to the space between the substrate 'W' supported on the lift pin assembly 3857 and the buffer plate 3870, or between the substrate 'W' supported onto the lift pin assembly 3857 and the cooling plate 3850.

The ultrasound applying member 3248 applies the ultrasound in the direction parallel to the substrate 'W'. The ultrasound applied between the substrate 'W' and the cooling plate 3850 generates vortex between the substrate 'W' and the cooling plate 3850. The vortex between the substrate 'W' and the cooling plate 3850 increases a convective heat transfer coefficient between the substrate 'W' and the cooling plate 3850. Accordingly, the stagnation of air between the substrate 'W' and the cooling plate 3850 is minimized, and thus the cooling time of the substrate 'W' is reduced.

According to one example, the ultrasound applying member 3248 is provided at one side portion of the buffer plate 3870 or the cooling plate 3850. For example, the ultrasound applying member 3248 may be provided on the support block 3830.

The above embodiment has been described in that the ultrasound applying member 3248 is provided in the driver 3246. However, according to another example, the ultrasound applying member 3248 may be provided at an opposite side to the side in which the driver 3246 is provided, inside the housing 3210.

Although the above embodiment has been described in that the cooling unit 1005 is provided in the transferring plate 3241, the transferring plate 3241 may be provided without the cooling unit 1005 according to another embodiment. Although the transferring plate 3241 does not include the cooling unit 1005, the ultrasound applying member 3248 may promote the natural cooling of the substrate 'W' on the transferring plate 3241.

Figure 11:
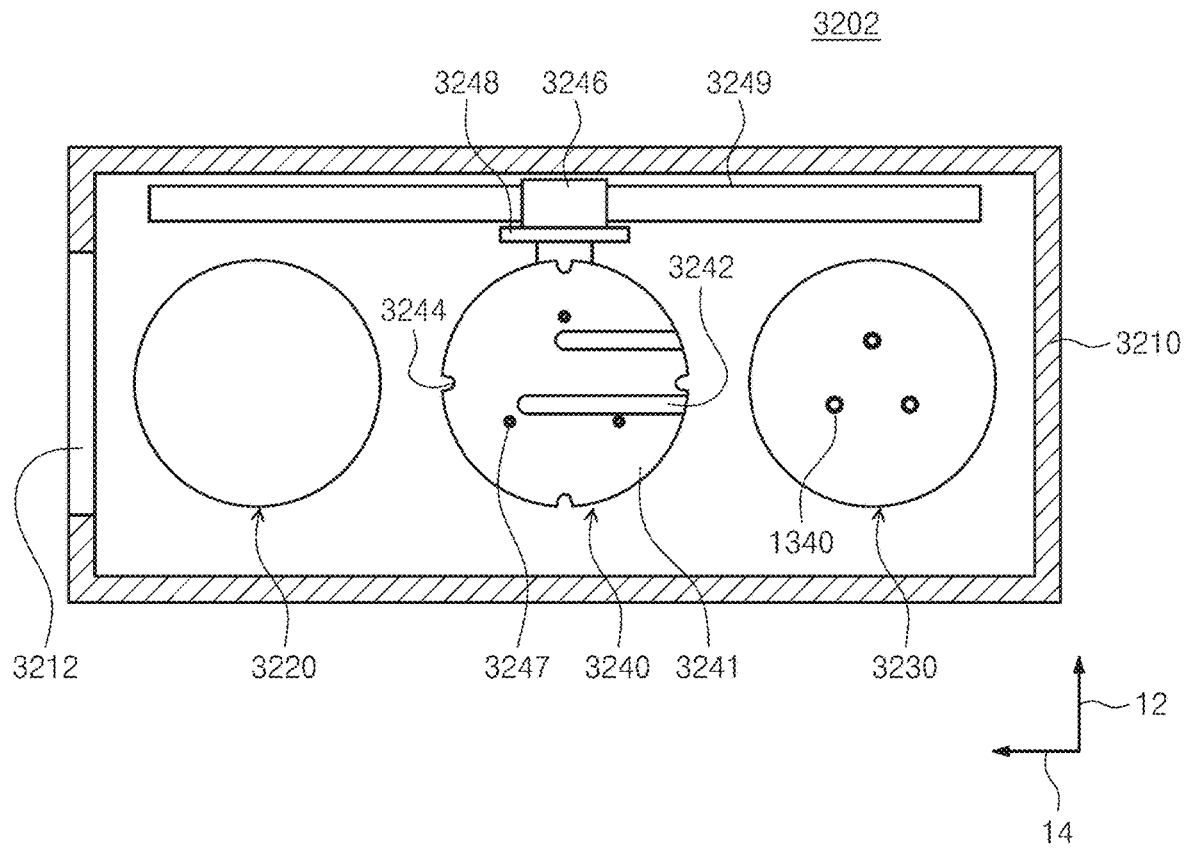
FIG. 11 is a plan view schematically illustrating a heat treating chamber of FIG. 3, according to another embodiment of the inventive concept.
Figure 12:
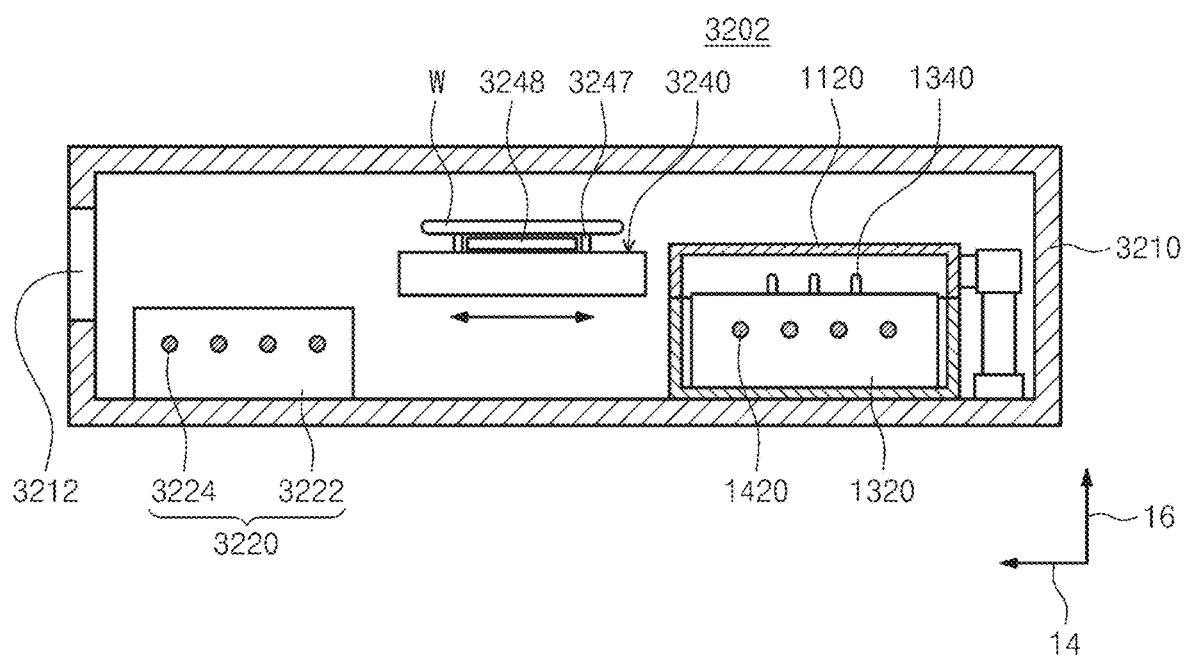
FIG. 12 is a front view illustrating the heat treating chamber of FIG. 11.

The above embodiment has been described in that the cooling unit 1005 is provided in the transferring plate 3241. However, according to another embodiment, the cooling unit 3220 may be provided separately at the outside of the transferring plate 3241 as illustrated FIGS. 11 and 12. The cooling unit 3220 and the heating unit 3230 are provided in parallel to the second direction 14. According to an embodiment, the cooling unit 3220 may be positioned more closely to the transferring chamber 3400 than the heating unit 3230. The cooling unit 3220 has a cooling plate 3222. The cooling plate 3222 may have a circular shape when viewed from above. The cooling plate 3222 has a cooling member 3224. According to an embodiment, the cooling member 3224 may be formed inside the cooling plate 3222 to serve as a fluid passage through which a cooling fluid flows.

The above embodiment has been described in that the ultrasound applying member 3248 is provided in the transferring unit 3240. However, according to another embodiment, the ultrasound applying member 3248 is provided in the buffer 3802 or 3804.

The above embodiment has been described in that the support plate to support the substrate 'W' includes the transferring plate 3241 provided in the transferring unit 3240 and the cooling plate 3850 provided in the buffer 3802 or 3804. However, according to another embodiment, the support plate may be used in various support devices to cool the substrate 'W' after heating the substrate 'W'

The above embodiment has been described in that the ultrasound applying member 3248 applies the ultrasound in a direction parallel to the substrate 'W'. However, according to another embodiment, the ultrasound applying member 3248 may be provided on the bottom surface of the support plate to apply an ultrasound toward the bottom surface of the substrate 'W'.

The above embodiment has been described in that the ultrasound applying member 3248 applies an ultrasound to the space between the cooling member to cool the substrate 'W', and the substrate 'W'. However, according to another embodiment, the ultrasound applying member 3248 may apply an ultrasound to the space between the heating member to heat the substrate 'W', and the substrate 'W'. Similarly to the case of cooling the substrate 'W', even when the substrate 'W' is heated, the ultrasound applied between the substrate 'W' and the heating member increases a convective heat transfer coefficient such that the heating efficiency of the substrate 'W' is increased.

According to the inventive concept, an ultrasound is applied to the space between the substrate 'W' and the plate for cooling the substrate 'W', thereby activating the convection in the space between the substrate 'W' and the plate for cooling the substrate 'W', such that the time to cool the substrate 'W' may be reduced.

In addition, according to the inventive concept, the ultrasound is applied to the space between the substrate and the plate for cooling the substrate such that the substrate finely moves. Accordingly, the substrate is prevented from being attached to the plate for cooling the substrate.

In addition, according to the inventive concept, the ultrasound is applied to the space between the substrate and the plate for cooling the substrate, thereby finely lifting the substrate from the plate for cooling the substrate. Accordingly, when the substrate is lifted, the squeeze phenomenon may be prevented.

According to an embodiment of the inventive concept, the cooling efficiency of the substrate may be improved by providing the ultrasound applying member to the transferring plate or the cooling plate.

According to an embodiment of the inventive concept, the cooling unit is provided to the transferring unit such that cooling through the cooling unit and natural cooling are performed together, thereby minimizing the cooling time.

In addition, according to an embodiment of the inventive concept, the squeeze phenomenon of the substrate may be minimized.

The above description has been made for the illustrative purpose. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to limit the inventive concept to the disclosed embodiments Furthermore, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A substrate treating apparatus comprising:
   a support plate;
   a plurality of protrusions protruding upward from the support plate to support a substrate;
   a temperature adjusting member provided in the support plate to heat or cool the substrate; and
   an ultrasound applying member configured to apply an ultrasound between the substrate placed on the plurality of protrusions and the support plate,
   wherein the ultrasound applying member applies the ultrasound in a direction parallel to the substrate.

2. The substrate treating apparatus of claim 1, wherein the temperature adjusting member is a cooling member configured to cool the substrate.

3. The substrate treating apparatus of claim 2, wherein the temperature adjusting member has a cooling fluid passage provided in the support plate.

4. The substrate treating apparatus of claim 1, wherein the temperature adjusting member is a heating member configured to heat the substrate.

5. The substrate treating apparatus of claim 1, wherein the ultrasound applying member is provided at one side portion of the support plate.

6. A substrate treating apparatus comprising:
   a housing;
   a heating unit including a heating plate positioned inside the housing to heat a substrate; and
   a transferring unit positioned inside the housing to transfer the substrate from the heating plate,
   wherein the transferring unit includes,
      a transferring plate configured to place the substrate,
      protrusions protruding upward from the transferring plate to support the substrate,
      a cooling unit configured to cool the substrate which is heated, and
      an ultrasound applying member configured to apply an ultrasound between the substrate and the transferring plate,
      wherein the ultrasound applying member applies the ultrasound in a direction parallel to the substrate.

7. The substrate treating apparatus of claim 6, wherein the cooling unit is provided in the transferring plate.

8. The substrate treating apparatus of claim 7, wherein the cooling unit is a cooling fluid passage.

9. The substrate treating apparatus of claim 6, further comprising:
   a driver configured to drive the transferring plate,
   wherein the ultrasound applying member is provided in the driver.

10. A transferring unit comprising:
    a transferring plate configured to place a substrate;
    protrusions protruding upward from the transferring plate to support the substrate;
    a cooling unit provided in the transferring plate to cool the substrate which is heated; and
    an ultrasound applying member configured to apply an ultrasound between the substrate and the transferring plate,
    wherein the ultrasound applying member is provided to apply the ultrasound in a direction parallel to the substrate.

11. The transferring unit of claim 10, wherein the cooling unit is provided in the transferring plate.

12. The transferring unit of claim 10, wherein the cooling unit is a cooling fluid passage.

13. The transferring unit of claim 10, further comprising:
    a driver configured to drive the transferring plate,
    wherein the ultrasound applying member is provided in the driver.

* * * * *